United States Patent [19]

Inoue et al.

[11] 4,456,850

[45] Jun. 26, 1984

[54] PIEZOELECTRIC COMPOSITE THIN FILM RESONATOR

[75] Inventors: Takeshi Inoue; Yoichi Miyasaka, both of Tokyo, Japan

[73] Assignee: Nippon Electric Co., Ltd., Tokyo, Japan

[21] Appl. No.: 465,316

[22] Filed: Feb. 9, 1983

[30] Foreign Application Priority Data

Feb. 9, 1982 [JP] Japan ................. 57-19105

[51] Int. Cl.$^3$ ............................................. H01L 41/08
[52] U.S. Cl. ............................... 310/324; 310/328; 310/331; 310/346
[58] Field of Search ............... 310/346, 338, 339, 331, 310/332, 311, 324, 328

[56] References Cited

U.S. PATENT DOCUMENTS

| | | | |
|---|---|---|---|
| 2,202,391 | 5/1940 | Mason | 310/346 X |
| 3,401,275 | 9/1968 | Curran et al. | 310/346 X |
| 3,437,849 | 4/1969 | Treatch et al. | 310/346 X |
| 3,486,046 | 12/1969 | Zalar | 310/324 |
| 3,505,572 | 4/1970 | Yamashita et al. | 310/328 X |

OTHER PUBLICATIONS

Acoustic Bulkwave Composite Resonators, by Lakin and Wang, Applied Physics Letters, vol. 38, No. 3, Feb. 1981, pp. 125-127.

Electronics Letters, Jul. 9, 1981, vol. 17, No. 14, ZnO/-SiO$_2$-Diaphragm Composite Resonator on a Silicon Wafer, pp. 507-509.

*Primary Examiner*—Mark O. Budd
*Attorney, Agent, or Firm*—Laff, Whitesel, Conte & Saret

[57] ABSTRACT

A piezoelectric composite thin-film resonator has good temperature stability and resonance response, in a fundamental thickness-extensional vibration mode. Spurious vibrations caused by even-number order harmonic overtones are suppressed. The resonator has a thin film of SiO$_2$ or other materials having a resonant frequency temperature coefficient which is opposite to that of the piezoelectric material. The SiO$_2$ layer is inserted between two thin films of ZnO, CdS, AlN, or other piezoelectric materials. This sandwiched structure is positioned between a pair of electrode films and is supported by an insulative or a semiconductive film which is in turn fixed to a substrate. The thicknesses of the thin films have values such that an overall temperature coefficient of the resonant frequency may be at or near substantially zero. In order to better remove the even-number order harmonics, it is preferable to cover the upper electrode film with a thin film of semiconductor or insulator material.

20 Claims, 14 Drawing Figures

PIEZOELECTRIC COMPOSITE THIN FILM RESONATOR

BACKGROUND OF THE INVENTION

The present invention relates to a piezoelectric resonator used for a filter, an oscillator, etc., and more particularly, to a highly stable high-frequency piezoelectric resonator which can be employed in a fundamental thickness-extentional-vibration mode in the VHF and UHF bands.

In general, a piezoelectric resonator is employed in a thickness-extensional-vibration mode of a piezoelectric thin plate, in a high frequency band. The following types of resonators have been known as piezoelectric resonators for a high frequency use:
(1) a piezoelectric resonator formed by polishing a piezoelectric plate (such as a quartz plate or a piezoelectric ceramics plate) into a thin plate and used in a fundamental vibration mode,
(2) an overtone resonator which utilizes a higher-order overtone vibration of a piezoelectric plate, such as a quartz plate or a piezoelectric ceramic plate, and
(3) a piezoelectric thin film resonator formed by a substrate of silicon or quartz and thin films of piezoelectric material such as ZnO, CdS, and AlN and of conductive electrode material formed on the substrate.

In the above mentioned resonator (1), the fundamental resonant frequency can be made higher in an inverse proportion to the thickness of the plate, by making the piezoelectric plate thinner. However, the difficulty in manufacturing is increased as the plate is made thinner. At present, the practical limit of the fundamental resonant frequency is about 50 MHz with a plate thickness 30–40 $\mu$m. The above mentioned resonator (2) has only a small electromechanical coupling coefficient due to the use of overtone mode vibration. Hence, a frequency band width sometimes becomes so small that it cannot be provided in a practical use. Moreover, a lower-order vibration having a larger electromechanical coupling coefficient would become a spurious vibration.

The above-mentioned resonator (3) has a large electromechanical coupling coefficient in the high frequency band of several hundreds MHz and can be utilized in a fundamental vibration even in the VHF and UHF band. However, ZnO, CdS, AlN, and other representative piezoelectric materials for the piezoelectric thin film have a large frequency temperature coefficient. Therefore, it is impossible to produce a piezoelectric resonator having a high temperature stability.

As a countermeasure for improving the temperature stability of the piezoelectric thin film resonator, it has been proposed to reduce an absolute value of a frequency temperature coefficient of a piezoelectric resonator, as a whole, by combining a piezoelectric material having a negative frequency temperature coefficient and a material having a positive frequency temperature coefficient. In detail, the article entitled "ZnO/SiO$_2$-Diaphragm Composite Resonator On A Silicon Wafer" appearing in "Electronics Letters" Vol. 17, No. 14, p.p. 507–509, disclosed a piezoelectric thin film resonator having a SiO$_2$ film of a positive coefficient formed on a surface portion of a silicon substrate. A lower electrode film is formed on the SiO$_2$ film. A ZnO piezoelectric thin film of a negative coefficient is deposited on the lower electrode film, and an upper electrode film is formed on the top. The portion of the silicon substrate exactly under the vibrating location is finally etched away. However, this structure still has a drawback, as will be explained later in detail with reference to the drawings. The thickness of the SiO$_2$ film becomes considerably larger as compared with the ZnO film for giving a zero temperature coefficient. Hence, the ZnO film is considerably deviated from a position of symmetry with respect to a vibrational nodal point of a fundamental thickness-extensional-vibration mode. The 2-nd order, 4-th, order, and the other even-number order harmonic overtones are strongly excited, as spurious modes, in addition to odd-number order hamonic overtones.

As a trial for suppressing the above-mentioned even-number order harmonic overtones, a thin film composite resonator is proposed. An additional SiO$_2$ thin film is provided on the upper electrode. In other words, a pair of SiO$_2$ thin films are provided on opposite sides of the upper and lower electrodes of the ZnO piezoelectric film, the SiO$_2$ films being symmetrically positioned with respect to the ZnO thin film. With this structure, the central portion of the ZnO piezoelectric thin film serves as a nodal point of vibration. The suprious effect due to the even number order harmonic overtones can be suppressed because electric charge is offset within the piezoelectric thin film. However, with regard to the film thickness ratio for obtaining a zero frequency temperature coefficient, the ZnO piezoelectric thin film (relative to the total film thickness at the vibrating location in this composite resonator) becomes thinner than the SiO$_2$ thin films. Thus, a good energy trapping becomes impossible. Accordingly, it is difficult to obtain an excellent resonance response in a resonator having a zero temperature coefficient.

SUMMARY OF THE INVENTION

It is an object of the present invention to provide a piezoelectric composite thin-film resonator having a good temperature stability and a good resonance response in a fundamental thickness-extensional vibration mode.

Another object of the present invention is to provide a piezoelectric composite thin film resonator in which spurious vibrations caused by even-number order harmonic overtones are sufficiently suppressed.

According to the present invention, a thin film of SiO$_2$ or other materials having a resonant frequency temperature coefficient opposite to the corresponding coefficient of the piezoelectric material is inserted between two thin films of ZnO, CdS, AlN, or other piezoelectric materials. This sandwiched structure is located between a pair of electrode films and supported by an insulative or a semiconductive film which is, in turn, fixed to a substrate. The thicknesses of the piezoelectric thin films and of the thin film of material having the opposite resonant frequency temperature coefficient are such values that an overall temperature coefficient of the resonant frequency may be substantially zero or near zero. In order to better remove the even-number, higher order harmonics, it is preferable to cover the upper electrode film of the above-described resonator structure with a thin film of semiconductor or insulator material.

BRIEF DESCRIPTION OF THE DRAWINGS

FIG. 13 shows one example of an application of the piezoelectric thin film composite resonator according to the present invention to a filter, FIG. 13(a) showing a plan view, and FIG. 13(b) showing a cross-sectional view.

DETAILED DESCRIPTION OF THE PRIOR ART

Figure 1:
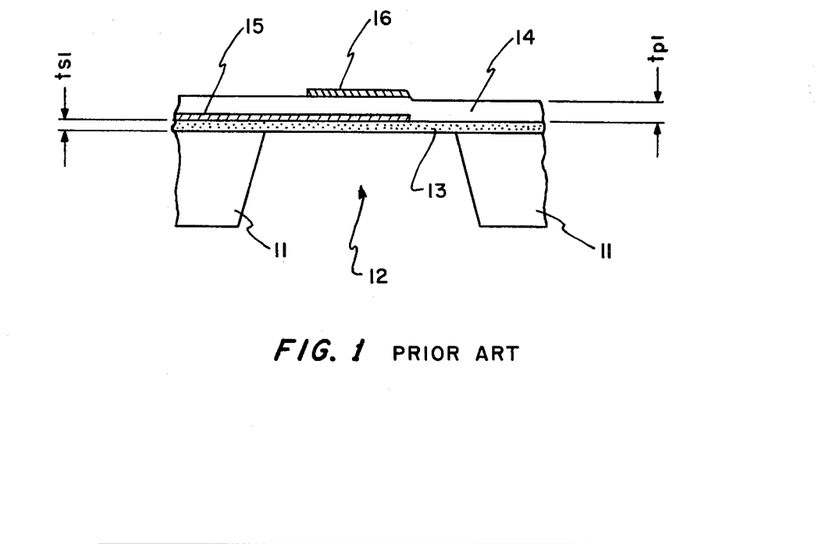
FIG. 1 is a cross-sectional view showing a piezoelectric composite thin film resonator, in the prior art.

FIG. 1 shows a structure disclosed by the article entitled "ZnO/SiO$_2$-Diaphragm Composite Resonator on a Silicon Wafer" appearing in "Electronics Letters" Vol. 17, No. 14, p.p. 507–509. A piezoelectric thin film is combined with a thin film of a material having an opposite resonant frequency temperature coefficient, as compared to the temperature of the coefficient piezoelectric material. This combination reduces an absolute value of a resonant frequency temperature coefficient of a piezoelectric resonator, as a whole.

Figure 2:
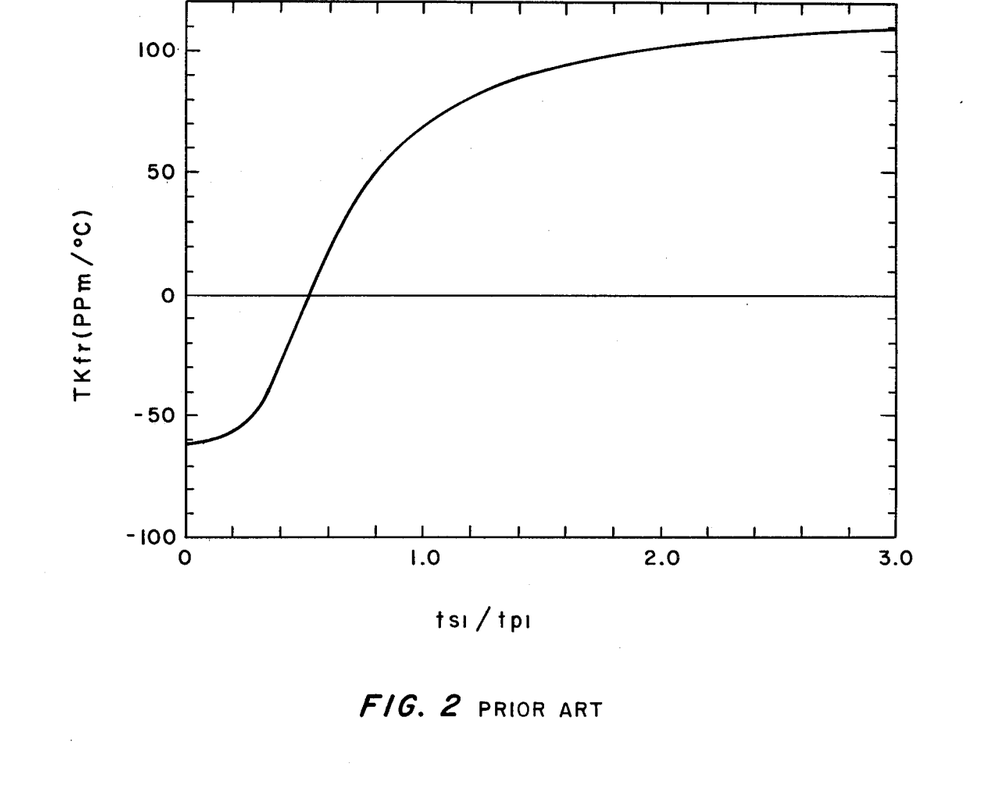
FIG. 2 is a diagram showing a relationship of a film thickness ratio versus a resonant frequency temperature coefficient of a ZnO/SiO$_2$ composite resonator, in the prior art shown in FIG. 1.

The structure comprises a silicon substrate 11 with an aperture 12 formed at a location where a lower electrode 15, a vibration thin film 14 and an upper electrode 16 are successively formed on the SiO$_2$ film 13. In FIG. 1 the designations, $t_{p1}$ and $t_{s1}$ respectively represent the film thicknesses of the ZnO and SiO$_2$ thin films. FIG. 2 shows a theoretically calculated relationship between temperature coefficient of the fundamental thickness-extensional-mode resonant frequency TKfr(ppm/°c) versus a film thickness ratio $t_{s1}/t_{p1}$ of the SiO$_2$ film 13 to the ZnO film 14 of the ZnO/SiO$_2$, which together form the composite piezoelectric resonator having the structure shown in FIG. 1. It is to be noted that frequency temperature coefficients of the ZnO film and the SiO$_2$ film are respectively negative and positive and their values are respectively −61.5 ppm/°C and 119.5 ppm/°C. From FIG. 2 it will be seen that when the ratio $t_{s1}/t_{p1}$ is about 0.5, a zero temperature coefficient can be obtained. However, with this structure, at the film thickness ratio for giving a zero temperature coefficient, the film thickness of the SiO$_2$ becomes considerably larger. Hence, with respect to a vibrational nodal point of the fundamental thickness-extensional-mode, the ZnO film would deviate considerably from the position of symmetry. Therefore, in addition to the odd-numbered order of harmonic overtones such as third, fifth, . . . harmonics, the even-numbered order of harmonic overtones such as second, fourth, . . . harmonics are strongly excited, as spurious modes.

Figure 3:
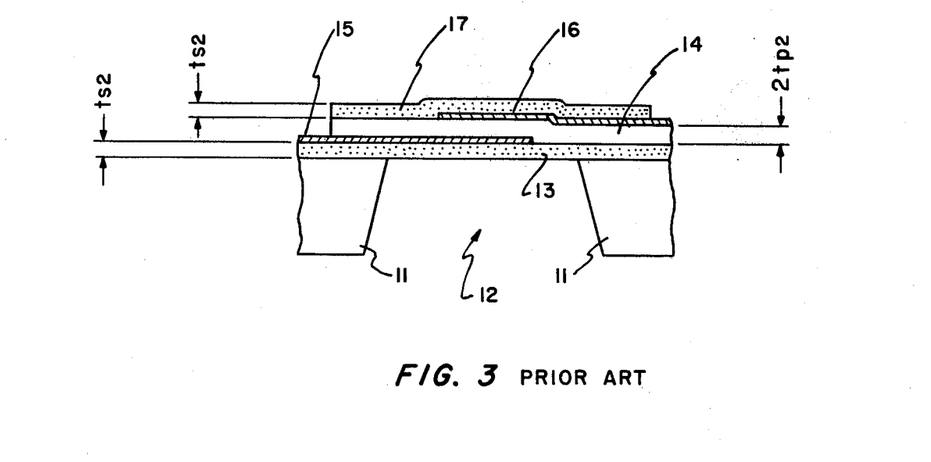
FIG. 3 is a cross-sectional view showing another piezoelectric composite thin film resonator, in the prior art.

FIG. 3 shows a structure for suppressing the even-numbered order of harmonic overtones generated in the composite piezoelectric resonator shown in FIG. 1. Referring to FIG. 3, a SiO$_2$ thin film 17 of the same thickness $t_{s2}$ as the SiO$_2$ film 13 is deposited over the upper electrode 16 and the piezoelectric thin film 14. In such a structure, a central portion of the Zno piezoelectric thin film 14 becomes a vibrational nodal point. Hence, the suprious modes caused by the even-numbered order of harmonic overtones are suppressed because the electric charge is cancelled within the piezoelectric film 14. It is to be noted that, in FIG. 3, $2t_{p2}$ and $t_{s2}$ respectively represent the film thickness of the Zno film 14 and of the SiO$_2$ film 13 (or 17).

Figure 4:
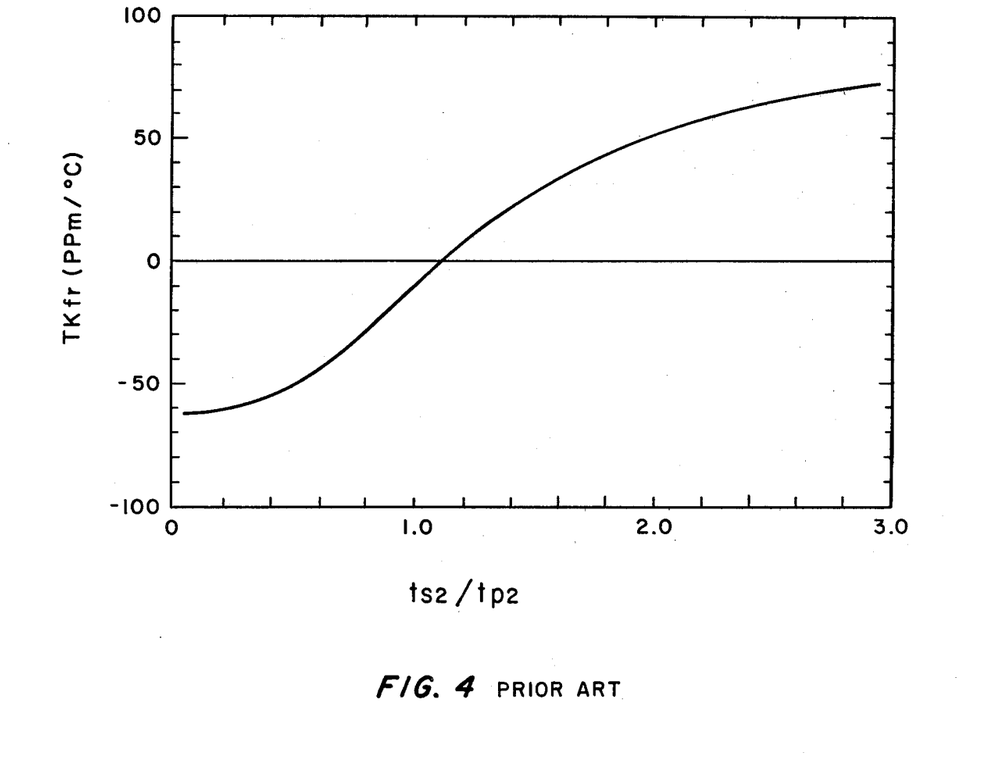
FIG. 4 is a diagram showing a relationship of a film thickness ratio versus a resonant frequency temperature coefficient of a ZnO/SiO$_2$ composite resonator, shown in FIG. 3.

FIG. 4 shows a relationship theoretically calculated from an equivalent distributed circuit of the film thickness ratio $t_{s2}/t_{p2}$ of the ZnO/SiO$_2$ composite resonator having the structure shown in FIG. 3 versus a temperature coefficient of the fundamental thickness-extensional-mode resonant frequency TKfr (ppm/°C). From FIG. 4, it will be seen that a film thickness ratio $t_{s2}/t_{p2}$ from which a zero temperature coefficient can be obtained is about 1.1. In other words, according to the condition for obtaining a zero temperature coefficient, the proporational thickness occupied by the ZnO piezoelectric thin film 14, relative to the total film thickness in the vibrating location of this composite resonator, is smaller than the proportional thickness of the two SiO$_2$ thin films 13 and 17. The ZnO piezoelectric thin film 14 itself can realize a vibrational energy trapping which is related to a fundamental thickness-extensional-vibration mode. However, in the case of the structure in which the thickness of the SiO$_2$ films on the both surfaces of the ZnO thin film are thick, the extent of the lowering of a resonant frequency due to a piezoelectric reaction becomes small, and an excellent energy trapping becomes impossible. Accordingly, as long as it is intended to obtain a zero temperature coefficient, the structure of FIG. 3 could not obtain a good resonance response.

DETAILED DESCRIPTION OF PREFERRED EMBODIMENTS

Figure 5:
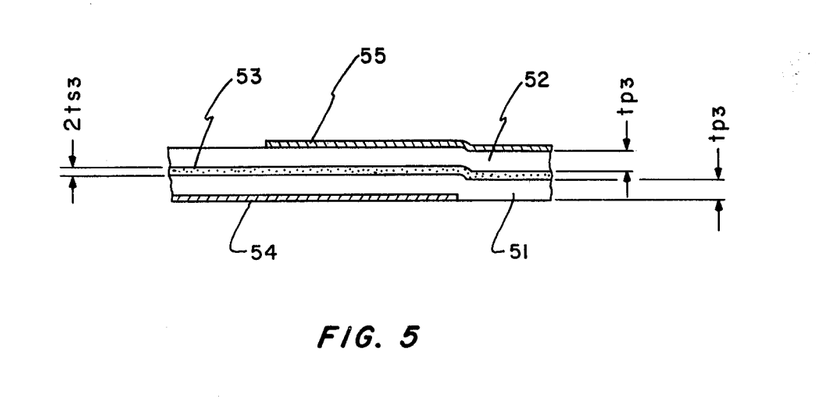
FIG. 5 is a cross-sectional view showing a part of a vibrating location of a piezoelectric composite thin film resonator, according to an embodiment of the present invention.

FIG. 5 shows a vibrating location part of a resonator according to one embodiment of the present invention.

Referring to FIG. 5, a single layer of thin film 53 is provided between piezoelectric thin films 51 and 52. The thin film 53 is formed of a material having an opposite resonant frequency temperature coefficient as compared to the corresponding of the coefficient piezoelectric film 51 and 52. Lower and upper electrodes 54 and 55 are respectively provided under the piezoelectric thin film 51 and on the piezoelectric thin film 52. In the illustrated embodiment, the piezoelectric thin film 51 and 52 are formed of ZnO. The material for the thin film 53 is $SiO_2$. In this figure, $t_{p3}$ and $2t_{s3}$ respectively, represent the film thickness of the ZnO and $SiO_2$.

Figure 6:
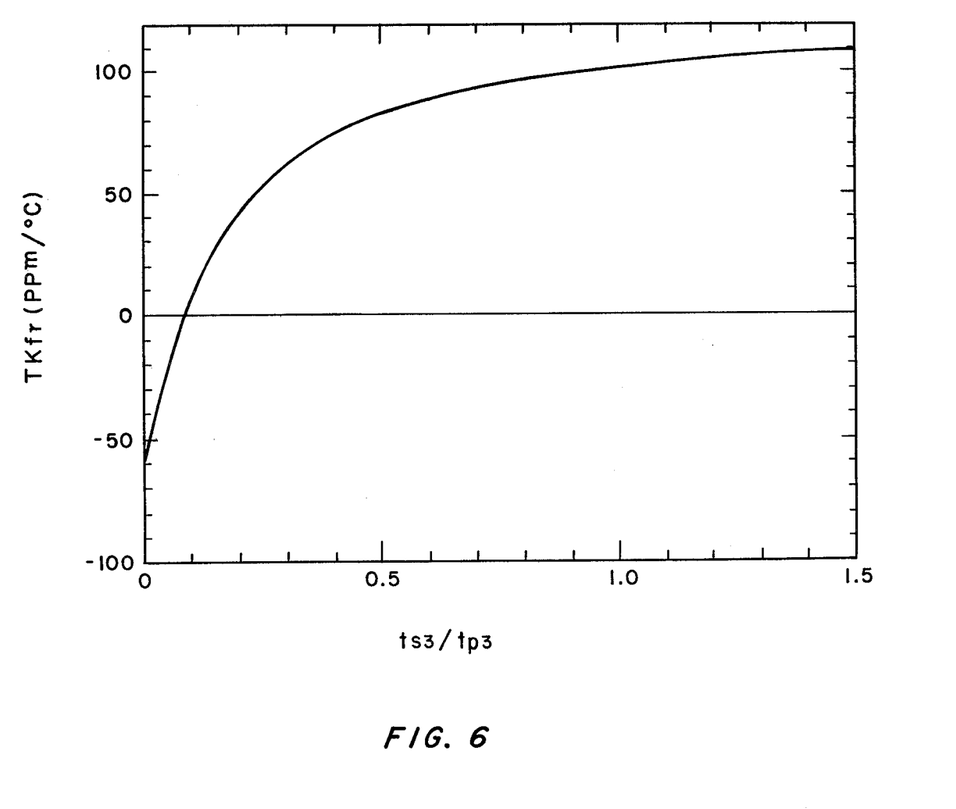
FIG. 6 is a diagram showing a relationship of a film thickness ratio versus a resonant frequency temperature coefficient of the composite resonator, shown in FIG. 5.

FIG. 6 shows a diagram theoretically calculated from a distributed constant equivalent circuit for the relationship of a film thickness ratio $t_{s3}/t_{ps}$ versus a resonant frequency temperature coefficient, for a fundamental thickness-extensional-vibration mode TKfr (ppm/°C) of the $ZnO/SiO_2/ZnO$ composite resonator having the structure shown in FIG. 5. A film thickness ratio $t_{s3}/t_{ps}$ for obtaining a zero temperature ratio is seen to be 0.085. That is, as compared to the film thickness of ZnO, the film thickness of $SiO_2$ can be made extremely small. Owing to the small film thickness of $SiO_2$, almost no inconvenience arises in the energy trapping effect, so that excellent resonance response can be obtained. Moreover, the piezoelectric films are located at vertically symmetrical positions with respect to a vibrational nodal point, so that the even-numbered order of harmonic overtones are not excited.

Figure 7:
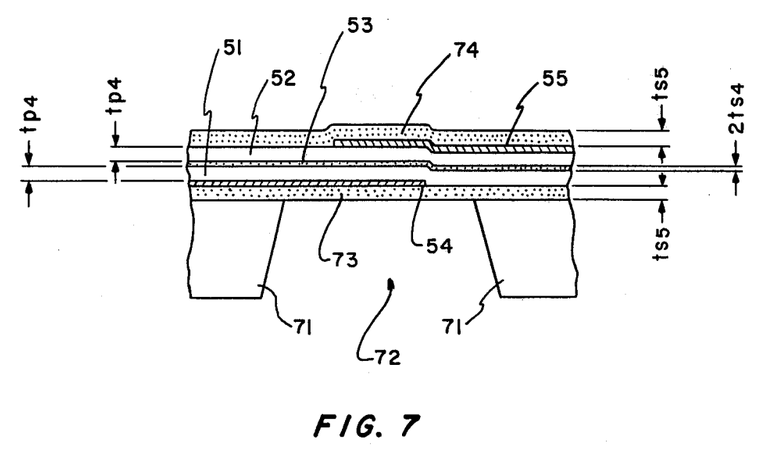
FIG. 7 is a cross-sectional view showing a basic structure of a piezoelectric composite thin film resonator, according to another embodiment of the present invention.

Referring to FIG. 7, a piezoelectric composite thin film resonator according to another embodiment of the present invention comprises a substrate 71. The periphery of a composite thin film structure is supported over a vacant opening 72 formed at the portion of the substrate 71 corresponding to the vibrating location. Opening 72 is formed by etching after the composite thin film structure is provided.

A material that is desirable for the substrate 71 is silicon whose surface is preferably a (100) surface. The reason is because if an etchant such as KOH or ethylene-diamine is used, an anisotropy of etching is that the etch rate for a <111> direction is very small as compared to the etch rate for a <100> direction. Hence, expansion of the etching in the lateral direction is extremely small. Accordingly the size of the vacant opening 72 can be controlled with a good precision.

A thin film 73 is provided on the substrate 71. This film 73 may be formed of either a semiconductor or an insulator material. It may be formed of polycrystalline silicon, monocrystalline silicon, silicon oxide, silicon nitride, or the like. It may be formed by diffusion or ion-inplantation of boron into the surface portion of the silicon substrate 71 before the opening 72 is formed, to make a boron doped silicon layer 73. Or, it may be formed by deposition of poly-or mono-crystalline silicon doped with boron at a high concentration on the silicon substrate 71. Otherwise, an insulator such as a $SiO_2$ thin film, $Si_3N_4$ thin film, etc. may be employed. Then the thickness of the thin film 73 can be controlled precisely, because for these thin insulator films, the etch rate by the etchant such as KOH or ethylene-diamine is extremely small.

On the thin film 73 are formed a lower electrode 54 and a piezoelectric thin film 51. A thin film 53 is made of a material having an algabraic sign of a resonant frequency temperature coefficient which is different from the corresponding algabraic sign of this piezoelectric thin film. Over film 53 are successively formed a piezoelectric thin film 52, an upper electrode 55, and a thin film 74 of semiconductor or insulator material. The thin film 74 has the functions of suppressing the even-numbered order of harmonic overtones and of effecting a frequency adjustment. Regarding the material of the piezoelectric thin films 51 and 52, at present ZnO is the most suitable material because it has an electromechanical coupling coefficient which is large and easy manufacture, but other piezoelectric materials may be used. It is known that a ZnO thin film can be produced with a good reproducibility into a thin film whose C-axis is oriented perpendicularly to the substrate surface. This production may be by a sputtering process, a CVD process, or an ion-plating process. Moreover, a thin film having a high resistivity can be produced.

Now, as one example of the piezoelectric composite thin film resonator having the structure shown in FIG. 7, a description will be made in the case where ZnO is employed for the piezoelectric thin films 51 and 52, and $SiO_2$ is employed for the thin film 53. Film 53 has an algebraic sign of a temperature coefficient of a resonant frequency of ZnO which is different than the algebraic sign for the thin films 73 and 74. The thickness of the ZnO films 51 and 52 are each represented by $t_{p4}$, and the thickness of the $SiO_2$ film 53 is represented by $2t_{s4}$. The thickness of the $SiO_2$ films 73 and 74 are each represented by $t_{s5}$.

Figure 8:
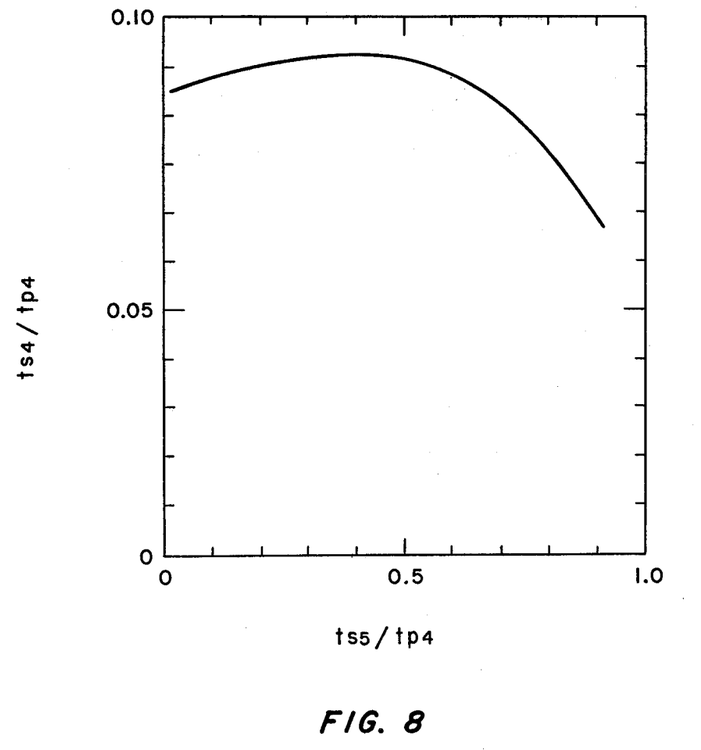
FIG. 8 is a diagram showing the relationship of the film thickness ratios for obtaining a zero resonant frequency temperature coefficient in the event that ZnO and SiO$_2$ are used in combination in the structure of the piecoelectric thin film composite resonator, shown in FIG. 7.

FIG. 8 shows a relationship between the film thickness ratio $t_{s4}/t_{p4}$ versus the thickness ratio $t_{s5}/t_{p4}$ for satisfying the conditions which produce a zero resonant frequency temperature coefficient of a fundamental thickness-extensional-vibration mode of this resonator. The curve of FIG. 8 was theoretically calculated from a distributed parameter equivalent circuit. A practically available portion is where the film thickness ratio $t_{s5}/t_{p4}$ is equal to or smaller than 0.5. In the event that it is larger than 0.5, as described previously, good energy trapping cannot be realized.

In the portion where the film thickness ratio $t_{s5}/t_{p4}$ is equal to or smaller than 0.5, the values of the other film thickness ratio $t_{s4}/t_{p4}$ for obtaining a zero temperature coefficient are nearly constant and fall in the range of 0.085 to 0.093. In other words, it is seen that, as compared to the film thickness $t_{s4}$ of the $SiO_2$ film 53 positioned inside the piezoelectric thin films 51 and 52, the influence upon a temperature coefficient of the film thickness $t_{s5}$ of the $SiO_2$ films 73 and 74 positioned outside the piezoelectric films 51 and 52 is extremely small. Since the thin films 73 and 74 are positioned near the acoustic free end portions of a fundamental thickness-extensional vibration mode, they operate almost as masses. Hence, the influence of the variety of materials of the thin films 73 and 74 upon the temperature coefficient of a piezoelectric resonator is not so large. Therefore, with regard to the thin films 73 and 74, it is obvious that besides $SiO_2$, other insulator thin films such as $Si_3N_4$ thin films that is hardly etched by an etchant such as KOH, ethylene-diamine, etc. or a silicon thin films doped with boron at a high concentration may be used, with a similar result.

The above-mentioned embodiment of FIG. 7 is the case where the film thickness of the thin films 73 and 74 in FIG. 7 are equal to each other. However, as shown in FIG. 8, the film thicknesses of the thin films 73 and 74 (represented by $t_{s5}$ in FIG. 7) can be made thin as compared to the film thickness of the piezoelectric thin films (represented by $t_{p4}$ in FIG. 7). In such a case, the film thicknesses of the thin films 73 and 74 need not be made equal to each other, while suppressing the suprious vibration caused by the even-numbered order of harmonic overtones.

Figure 9:
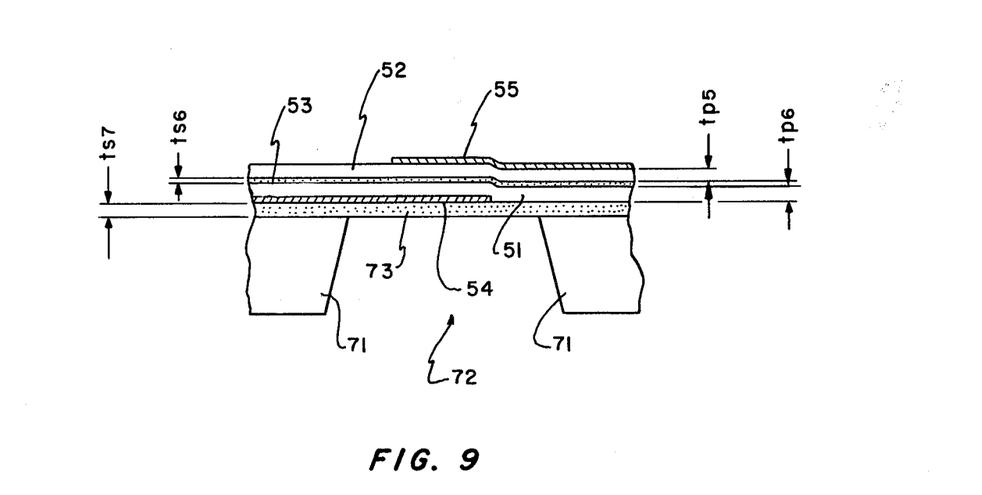
FIG. 9 is a cross-sectional view showing a structure of a piezoelectric thin film composite resonator, according to the present invention.
Figure 10:
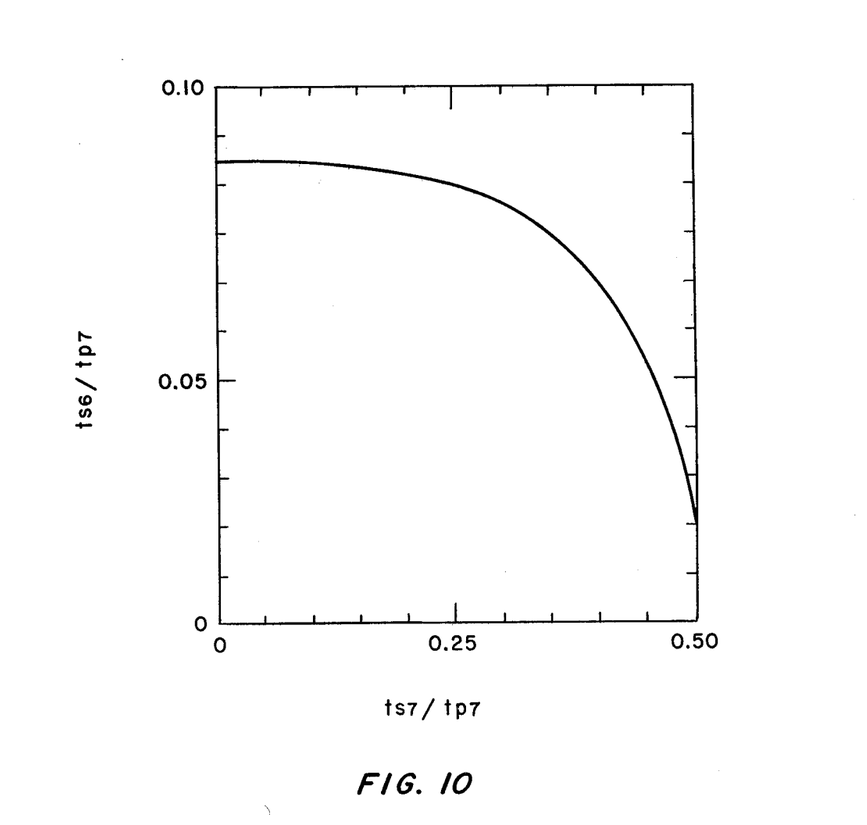
FIG. 10 is a diagram showing the relation of the film thickness ratios for obtaining a zero resonant frequency temperature coefficient in the event that ZnO and SiO$_2$ are used in combination in the structure of the piezoelectric thin film composite resonator shown in FIG. 9.

Furthermore, the upper thin film 74 in the structure shown in FIG. 7 can be removed to obtain a composite thin film resonator as illustrated in FIG. 9, which has a good performance close to the performance that is of the structure in FIG. 7. FIG. 10 shows the theoretically calculated relationship of the respective film thickness ratio for obtaining a zero resonant frequency temperature coefficient of a fundamental thickness-extensional-vibration mode of the resonator. Thin films of ZnO are used as the piezoelectric thin films 51 and 52 and $SiO_2$ is used for the thin films 53 and 74 in the structure of FIG. 9. In FIGS. 9 and 10, $t_{p5}$ and $t_{p6}$ respectively represent the thickness of the ZnO thin films 52 and 51 and $t_{p7} = t_{p5} + t_{p6}$. In addition, $t_{s6}$ represents the thickness of the $SiO_2$ thin film 53 formed nearly at the central portion of the vibrating section. Further, $t_{s7}$ represents the thickness of the thin film 73 consisting of an insulator or semiconductor material.

As will be seen from FIG. 10 also, the thin film 73 can be made thinner than any of the piezoelectric thin films 51 and 52. In this case, the thickness $t_{p5}$ and $t_{p6}$ of the piezoelectric films 52 and 51 may be equal to each other or, they may have different values such that the thin film 53 is positioned at the center of the overall composite thin films, at the vibrating location.

In the above explanation, ZnO and $SiO_2$ are used for the piezoelectric thin films 51 and 52 and for the thin film 53 inserted therebetween, respectively. However, a piezoelectric material other than ZnO may be used. A thin film material other than $SiO_2$, having an opposite resonant frequency temperature coefficient as compared to that of the piezoelectric material, may be also used, provided that these piezoelectric material and thin film material have appropriate resonant frequency temperature coefficients with respect to each other. In this case, the feature and effectiveness of the present invention is not lost at all.

It is to be noted that the inventive piezoelectric composite thin film resonator is extremely effective as a resonator in the resonant frequency range from 50 MHz to 1 GHz. Mechanical machining for making the resonator from a piezoelectric plate is difficult above 50 MHz, but the resonator above 50 MHz can be manufactured through the composite thin film of the invention. Nevertheless, a practical structure is hard to be realized above 1 GHz. Corresponding to the resonant frequency range, the thickness of the composite resonator may have the total thickness $2(t_s + t_p)$. This thickness consists of piezoelectric thin films each having a thickness $t_p$ and a thin film having a thickness $2t_s$ inserted therebetween. This total thickness has a value of about 50 μm to 3 μm. The thickness $t_p$ of the piezoelectric film and the thickness $t_s$ of the inserted thin film are determined by distributing the total thickness to realize a ratio $t_s/t_p$ of 0.085 to 0.093.

With regard to the inventive piezoelectric composite thin film resonator having the structure shown in FIG. 7 or FIG. 9, a detailed description of its manufacture will be made. For obtaining the structure shown in FIG. 9, at first a silicon substrate 71 with a (100) surface is prepared. A $Si_3N_4$ thin film 73 of 1.5 μm thickness is deposited on the substrate 71 by a CVD process. Subsequently, a hollow opening 72 is formed by use of an etchant consisting of ethylene-diamine, pyrocatechol and water and by making use of a $Si_3N_4$ film (not shown) preliminarily formed on the back surface of the substrate 71, as a mask. Then, Cr is deposited on the $Si_3N_4$ film 73 an underlayer, and Au is deposited thereon by evaporation. These metal films are selectively removed by photolithography to form a lower electrode 54. Then, a ZnO thin film 51 of 3.4 μm thickness, a $SiO_2$ thin film 53 of 0.6 μm thickness and a ZnO thin film 52 having the same thickness as the ZnO thin film 51 are successively deposited by sputtering. Thereafter, an upper electrode 55 of Al is formed.

Figure 11:
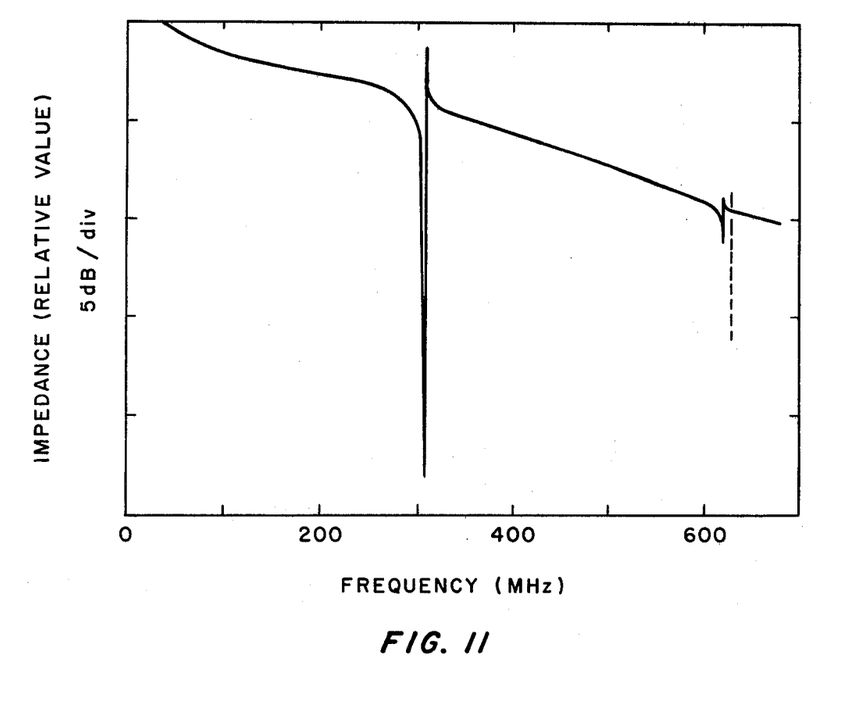
FIG. 11 is a diagram showing an impedance characteristic of the piezoelectric thin film composite resonator shown in FIG. 9.

With the resultant piezoelectric thin film resonator, a resonant frequency was obtained at 321.9 MHz with, a resonance quality factor of 2800 and resonant frequency temperature coefficient of −2.2 ppm/°C. A solid line in FIG. 11 shows an impedance characteristic of the resultant resonator. It is to be noted that in this figure, a dashed line represents a spurious effect caused by the second order harmonic resonance in the prior art piezoelectric thin film resonator shown in FIG. 1. From this figure it is obvious that the inventive piezoelectric thin film resonator is effective for suppressing the second order harmonic resonance.

Figure 12:
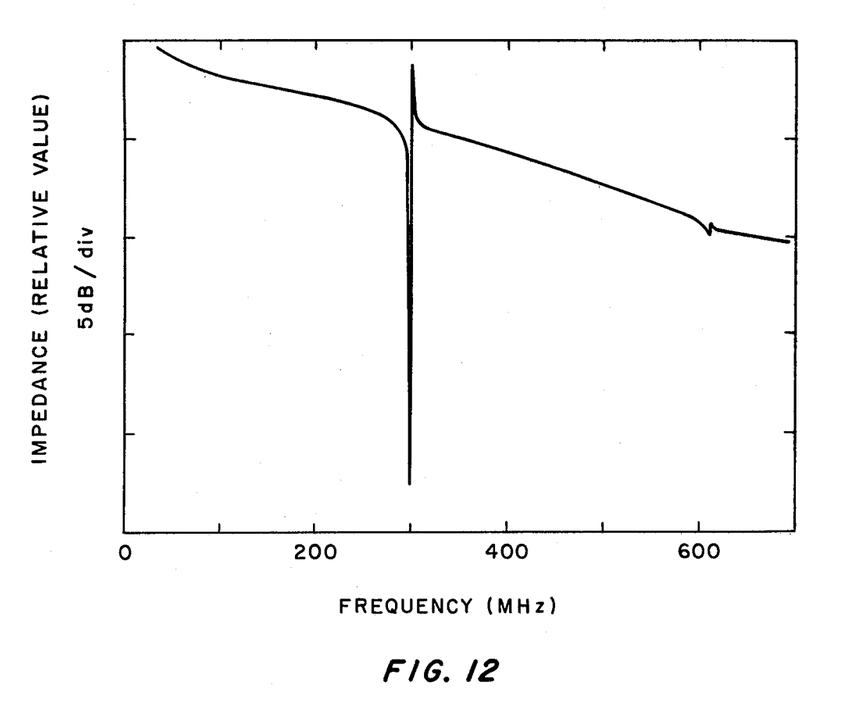
FIG. 12 is a diagram showing an impedance characteristic of the piezoelectric thin film composite resonator shown in FIG. 7.

Furthermore, a $SiO_2$ film 74 of 1.2 μm thickness was formed by a sputtering process over the Al electrode 55 and the exposed surface of the ZnO thin film 52 of the piezoelectric thin film resonator shown in FIG. 9, and to produce a piezoelectric thin film resonator as shown in FIG. 7. A resonant frequency of 300.0 MHz, a resonant quality factor of 2900 and a resonant frequency temperature coefficient of −1.7 ppm/°C. were obtained by the resonator of FIG. 7. With this resonator, moreover, the spurious vibration caused by the second order harmonic resonance was further suppressed, as shown in FIG. 12, to 1/5 of the characteristics represented by a solid line in FIG. 11.

Figure 13A:
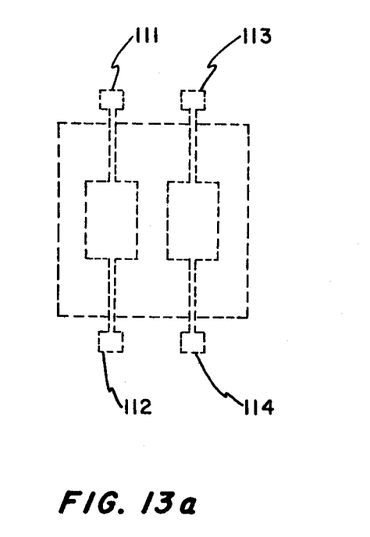
Figure 13B:
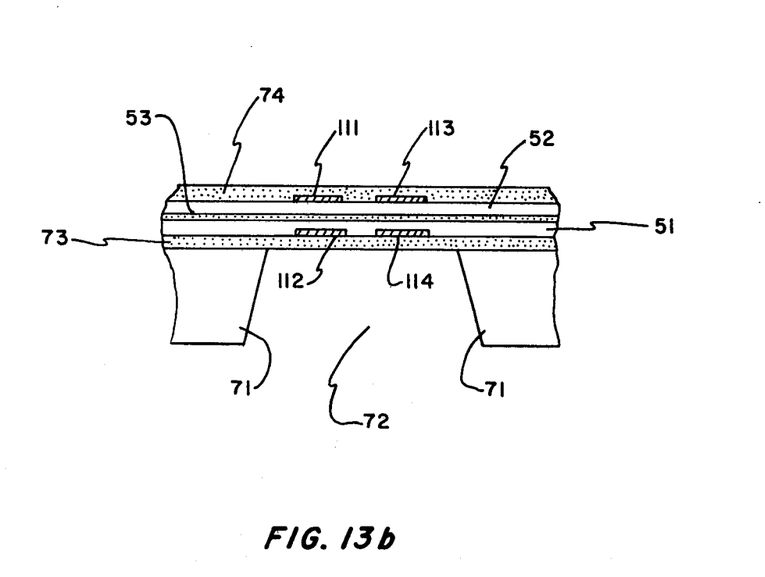

By a use of the structure of the piezoelectric composite thin film resonator according to the present invention, a filter can be easily realized by providing a plural number of opposed electrode pairs 111, 112 and 113, 114. The left side electrodes 111, 112 are employed as input electrodes and the right side electrodes 113, 114 as output electrodes, as shown in FIGS. 13(a) and 13(b). The same films and parts that appear in FIGS. 7 and 13a, 13b are indicated by identical reference numerals.

As described in detail above, according to the present invention, a piezoelectric composite thin film resonator is provided for high frequency use. There is an extremely excellent temperature stability. The resonator can sufficiently suppress the spurious vibration caused by the even-numbered order of harmonic overtones.

What is claimed is:

1. A piezoelectric thin film resonator comprising a first thin film formed of a semiconductor or an insulator material, a lower electrode formed on said first thin film, a piezoelectric thin film formed on said lower electrode, a second thin film formed of a material having an opposite resonant frequency temperature coefficient as compared to the corresponding coefficients of said piezoelectric thin film and positioned on said piezoelectric thin film, another piezoelectric thin film formed on said second thin film, and an upper electrode formed on said other piezoelectric thin film, the total thickness of the two piezoelectric thin films and said second thin film being within the range of 50 μm to 3 μm and the ratio of the thickness of said second thin film to the thickness of said two piezoelectric thin films being in the range of 0.085 to 0.093.

2. The resonator as claimed in claim 1, further comprising a substrate having an aperture, said first thin film being fixed to said substrate and covering said aperture.

3. The resonator as claimed in claim 1, further comprising a third thin film formed of a semiconductor or an insulator material covering said upper electrode.

4. The resonator as claimed in claim 1, wherein the thicknesses of said piezoelectric thin films and the thickness of said second thin film are selected so that a resonant frequency temperature coefficient of said resonator may be nearly zero.

5. The piezoelectric thin film resonator as claimed in claim 1, wherein the material of said piezoelectric thin films is selected from the group consisting of ZnO, CdS and AlN.

6. The piezoelectric thin film resonator as claimed in claim 5, wherein the material of said second thin film is $SiO_2$.

7. The piezoelectric thin film resonator as claimed in claim 3, wherein the material of said first and third thin films is selected from the group consisting of Si, $SiO_2$, and $Si_3N_4$.

8. The resonator as claimed in claim 1, wherein said piezoelectric thin films are formed of ZnO and said first and second thin films are formed of $SiO_2$.

9. The resonator as claimed in claim 3, wherein the ratio of the thickness of the one of said first and third thin films to the thickness of one of said piezoelectric thin films is 0.5 or less.

10. A piezoelectric thin film resonator in a fundamental thickness-extensional-vibration mode comprising a first thin film as a substrate, a lower electrode partially formed on said first thin film, a piezoelectric thin film continuously formed on said first thin film and said lower electrode, a second thin film formed of a material having a temperature coefficient of a resonant frequency of the fundamental thickness-extensional-vibration mode which is opposite to the corresponding coefficient of said piezoelectric thin film and covering said piezoelectric thin film, another piezoelectric thin film covering said second thin film, and an upper electrode partially formed on said other piezoelectric thin film, said second thin film being free from any mechanical contact other than with the two piezoelectric thin films, the relative thickness of said second thin film to said two piezoelectric thin films being selected so that spurious vibrations caused by even-number order harmonic overtones may be substantially suppressed with a reduced temperature coefficient at the resonant frequency of the fundamental thickness-extensional-vibration mode of said resonator.

11. The resonator as claimed in claim 10, wherein the total thickness of the two piezoelectric thin films and said second thin film is within the range of 50 μm to 3 μm and the ratio of one-half of the thickness of said second thin film to the thickness of one of said two piezoelectric thin films is in the range of 0.085 to 0.093.

12. The resonator as claimed in claim 10, further comprising a third thin film formed of a semiconductor or an insulator material covering said upper electrode.

13. The resonator as claimed in claim 11, wherein the ratio of the thickness of said first and third thin films to the thickness of said two piezoelectric thin films is 0.5 or less.

14. The piezoelectric thin film resonator as claimed in claim 11, wherein the material of said first and third thin films is taken from the group consisting of Si, $SiO_2$, and $Si_3N_4$.

15. The resonator as claimed in claim 11, wherein said piezoelectric thin films are formed of ZnO and said first and second thin films are formed of $SiO_2$.

16. The piezoelectric thin film resonator as claimed in claim 10, wherein the material of said second thin film is $SiO_2$.

17. The piezoelectric thin film resonator as claimed in claim 10, wherein the material of said piezoelectric thin films is taken from the group consisting of ZnO, CdS and A N.

18. The resonator as claimed in claim 10, further comprising a substrate having an aperture, said first thin film being fixed to said substrate and covering said aperture.

19. The resonator as claimed in claim 18, further comprising a third thin film formed of a semiconductor or an insulator material covering said upper electrode.

20. The piezoelectric thin film resonator as claimed in claim 19, wherein the material of said first and third thin films is taken from the group consisting of Si, $SiO_2$, and $Si_3N_4$.

* * * * *